United States Patent [19]
Yamashita

[11] Patent Number: 5,208,506
[45] Date of Patent: May 4, 1993

[54] LAMINATED PIEZOELECTRIC ACTUATOR

[75] Inventor: Osamu Yamashita, Tokyo, Japan

[73] Assignee: NEC Corporation, Tokyo, Japan

[21] Appl. No.: 791,433

[22] Filed: Nov. 13, 1991

[30] Foreign Application Priority Data

Nov. 14, 1990 [JP] Japan .................................. 2-307664

[51] Int. Cl.$^5$ ..................... H01L 41/04; H01L 41/08; H01L 41/09
[52] U.S. Cl. .................................. 310/328; 310/348; 310/366
[58] Field of Search ................ 310/328, 344, 348, 366

[56] References Cited

U.S. PATENT DOCUMENTS

| | | | |
|---|---|---|---|
| 2,434,043 | 1/1948 | Kershaw | 310/344 |
| 4,011,474 | 3/1977 | O'Neill | 310/328 |
| 4,408,832 | 10/1983 | Hartman | 310/328 |
| 4,454,441 | 6/1984 | Taniguchi | 310/328 |
| 4,781,477 | 11/1988 | Nagasawa | 310/328 |
| 4,849,668 | 7/1989 | Crawley et al. | 310/328 |
| 4,958,100 | 9/1990 | Crawley et al. | 310/328 |

FOREIGN PATENT DOCUMENTS

| | | | |
|---|---|---|---|
| 0231884 | 12/1984 | Japan | 310/328 |
| 0031182 | 2/1987 | Japan | 310/366 |
| 0055985 | 3/1988 | Japan | 310/366 |
| 0262065 | 10/1988 | Japan | 310/348 |

Primary Examiner—Steven L. Stephan
Assistant Examiner—C. LaBalle
Attorney, Agent, or Firm—Laff, Whitesel, Conte & Saret

[57] ABSTRACT

A laminated piezoelectric actuator includes a plurality of electrostrictive elements which are connected with each other. Each element 1 is a structure alternately laminated with electrostrictive material layers and internal electrode layers. The elements are sealed in an enclosure consisting of a metallic casing 5 with at least one metallic member 3 and 6 fixed to an aperture of the casing 5. The actuator has a supporting member 7 for connecting and positioning the elements 1 in their longitudinal displacing direction. The supporting member 7 has a notch formed on its opposed lateral surfaces which provides an exit for leads connected to the plurality of electrostrictive affect elements. In the actuator, even if the voltage is repeatedly turned on and off, the electrostrictive material layer will not crack and the connecting portion cannot slip off.

3 Claims, 4 Drawing Sheets

LAMINATED PIEZOELECTRIC ACTUATOR

BACKGROUND OF THE INVENTION

The present invention relates to a laminated piezoelectric actuator and particularly, to a construction of a connecting portion of the piezoelectric actuator in which a plurality of electrostrictive effect elements are connected with each other in their longitudinal displacing direction.

Conventionally, as an actuator utilizing the electrostrictive effect, a laminated piezoelectric actuator which allows a large displacement to be achieved has been used. This actuator has been made in the following manner: After a film of piezoelectric ceramic material is formed with a thickness of about 100 μm and an electroconductive paste is printed on its surface, it is cut into a predetermined size to form sheets, which are laminated by tens to hundreds of layers. On each surface of this laminated structure, a sheet of piezoelectric ceramic material without the electroconductive paste is laminated by several to tens of layers. It is sintered and polished in order to make its thickness constant. Thereafter, cutting and insulating operations and formation of leads are carried out to thereby obtain an electrostrictive effect element in which the distance between electrodes is small and the number of laminated layers is large.

The displacement of the electrostrictive effect element thus obtained accounts for about 10 μm to 20 μm (when 150 V is applied). If a further large displacement is required, then it is possible by increasing the number of laminated layers of the above-described sheet but, if the number of the laminations is increased, a crack or peeling can take place at the time of sintering.

Therefore, conventionally, in order to obtain a further large displacement, the electrostrictive effect elements obtained as above have been adhered to each other with an adhesive agent to form a stack, and it has been sealed with an enclosure consisting of a metallic casing and metallic members to make the actuator.

FIG. 1 is a longitudinal view in cross section illustrating the construction of such a conventional laminated piezoelectric actuator.

Referring to FIG. 1, a plurality of electrostrictive effect elements 1 are adhered to each other with an adhesive agent 11 to form a stack and the electrodes of these elements are connected to lead terminals 2a, 2b via leads 4a, 4b. Two disc-shaped metallic members 3, 6 are joined to aperture portions 5a, 5b of a cylindrical metallic casing 5. The upper and lower end portions 1a and 1b of the stack of electrostrictive effect element 1 are each adhered to the recess portions each formed on the inner surface of the metallic members 3 and 6 by means of the adhesive agent 11.

Incidentally, although, in general, the displacement of the electrostrictive effect element utilizes a longitudinal strain of the piezoelectric ceramic, which is caused by the applied voltage, at the same time, a transverse strain also takes place, which magnitude is proportional to the strength of the electric field. As a result, when the voltage is applied, the strength of the electric field of the piezoelectric ceramic at the adhered portion amounts to the order of one tenth to one thousandth of that of the piezoelectric ceramic at the other portion, and the transverse strain also assumes a similar difference. In order to absorb this difference in the transverse strains, as for the shape of the electrostrictive effect element, the piezoelectric ceramic at the adhered portion is deformed in a convex form. In consequence, when a plurality of elements are adhered, the adhered surface tends to deform into the convex form each time the voltage is applied to the piezoelectric actuator, causing a large stress in the neighborhood of the adhered portion. Therefore, if the voltage is repeatedly turned on and off, a peeling can take place at the adhered layer or a crack can take place on the piezoelectric ceramic in the neighborhood of the adhered layer.

In addition, depending on the material or thickness of the adhesive agent, the displacement can be absorbed and reduced by the order of tens of percent at each adhered layer.

SUMMARY OF THE INVENTION

An object of the present invention is to provide a laminated piezoelectric actuator in which, even if the voltage is repeatedly turned on and off, neither peeling can take place at the adhered layer nor crack can take place on the piezoelectric ceramic in the neighborhood of the adhered layer while a reduction of its displacement, which is caused by the connection of the electrostrictive elements, is small.

The laminated piezoelectric actuator according to the present invention has a feature that a plurality of piezoelectric effect elements are inserted into a tubular supporting member which has an internal form corresponding to the profile of the elements and is capable of connecting and positioning the elements in the direction of displacement so as to fix the elements without using the adhesive agent.

According to the present invention, when the plurality of electrostrictive effect elements are stacked to each other, they are incorporated into the supporting member to press and fix by a spring pressure of the metallic casing so that, when the voltage is applied to the laminated piezoelectric actuator, the deformation of the contacting portion for the elements, which is caused by the difference between the strength of the electric field of the piezoelectric ceramic in the neighborhood of the contacting portion and that of the piezoelectric ceramic between the internal electrode conductor layers, cannot be prevented and, even if the voltage is repeatedly turned on and off, the crack cannot take place on the ceramic or the contacting portion cannot slip off.

In addition, since no adhesive agent is used for connecting the electrostrictive effect elements, the number of man-hours required for connection can be drastically reduced, and damage of the adhered interface, which can be caused by the thermal stress as occurs when they are cured, can also be effectively prevented.

DETAILED DESCRIPTION OF THE PREFERRED EMBODIMENTS

Figure 1:
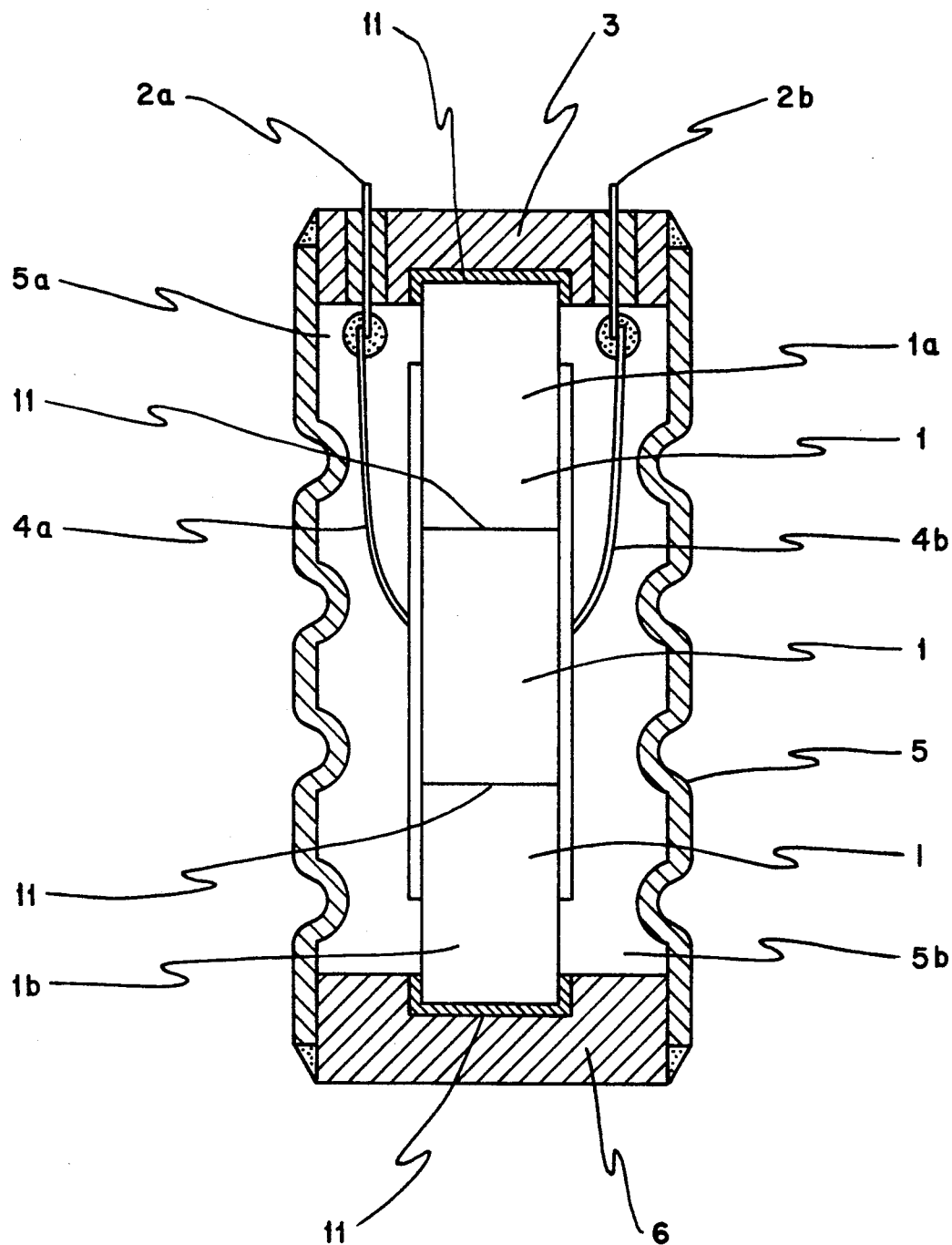
FIG. 1 is a longitudinal view in cross section of a conventional metallic casing-incorporated piezoelectric actuator.
Figure 2:
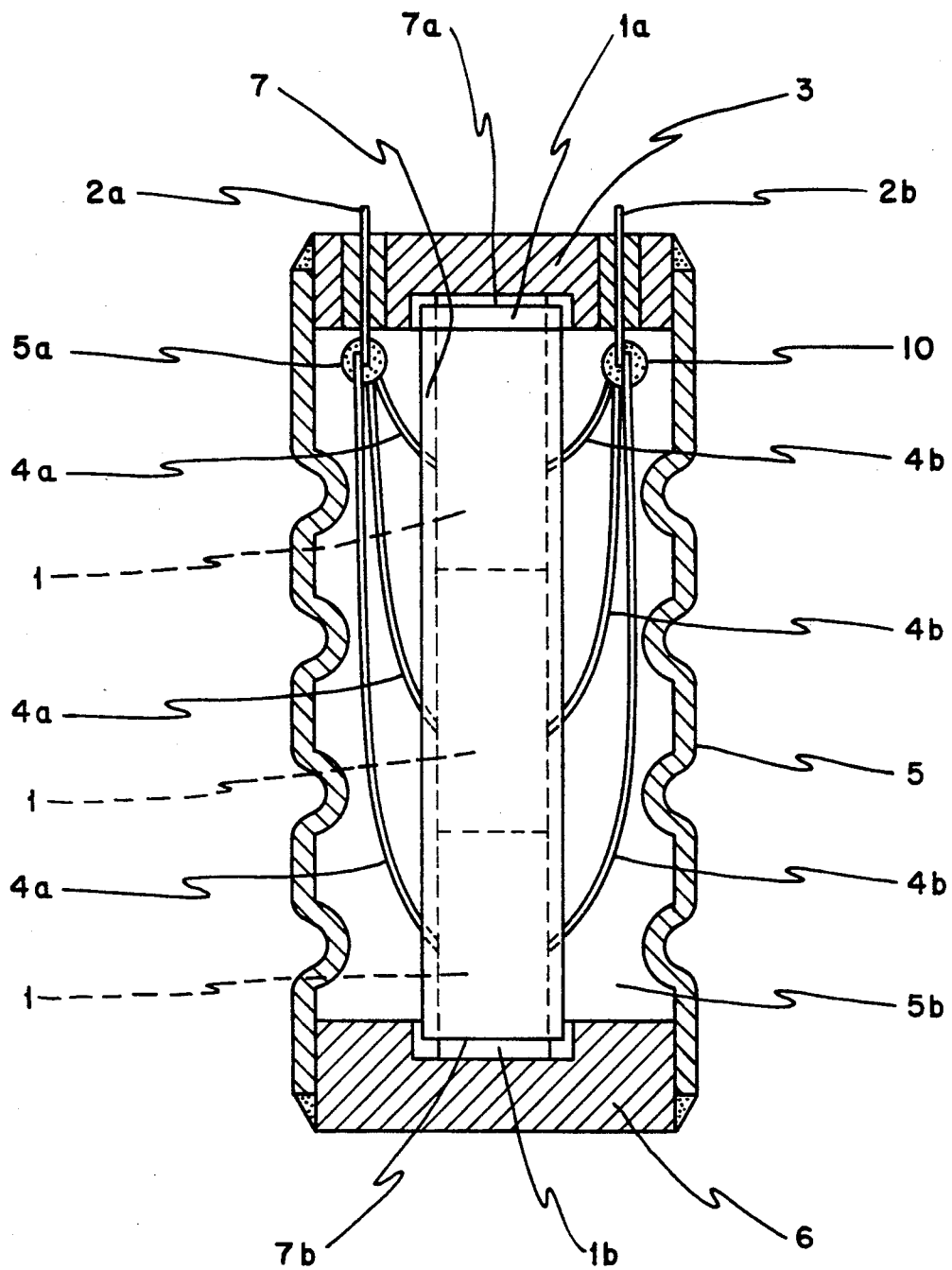
FIG. 2 is a longitudinal view in cross section of a laminated piezoelectric actuator according to an embodiment of the present invention.
Figure 3:
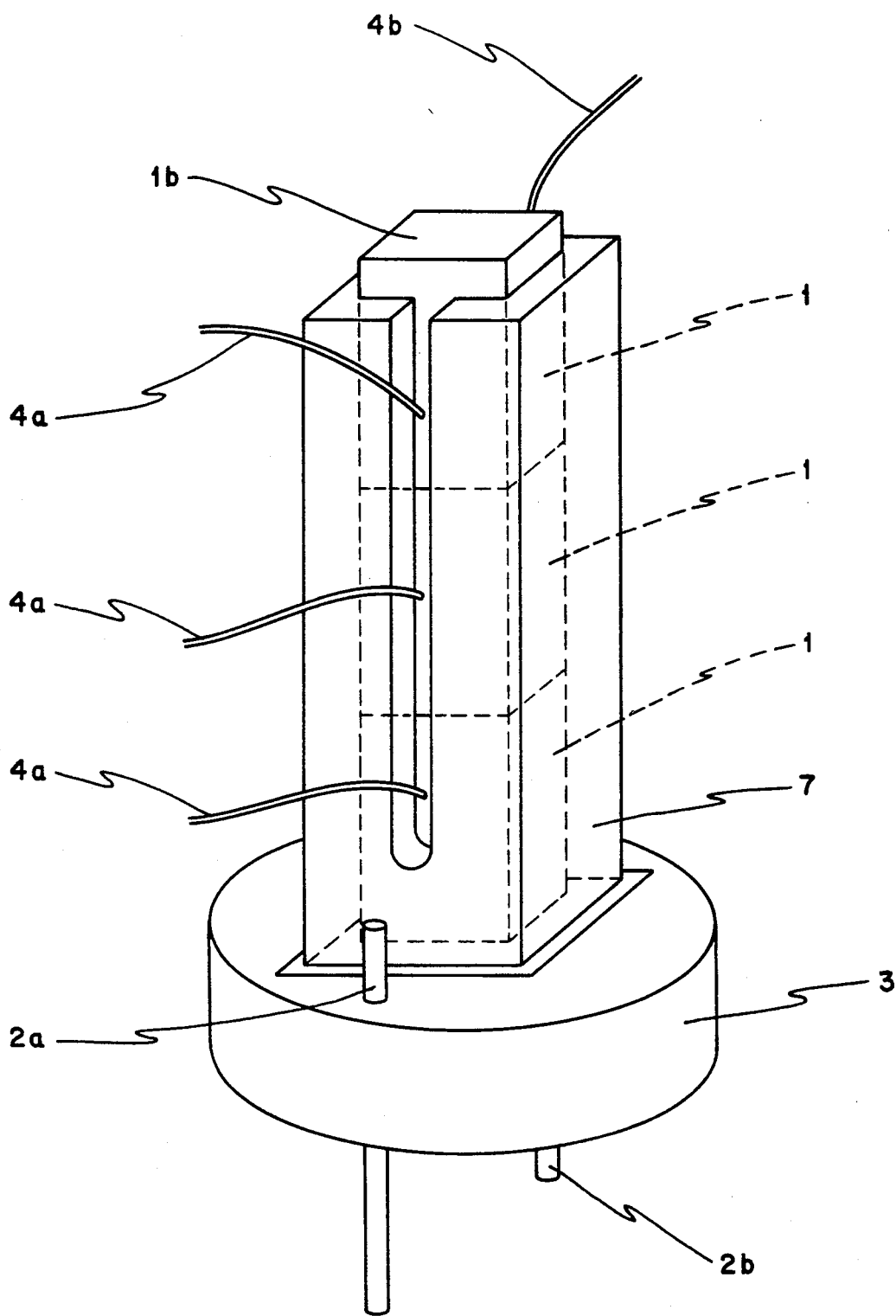
FIG. 3 is a partially omitted perspective view of the actuator of FIG. 2.

Referring to FIGS. 2 and 3, a plurality of electrostrictive effect elements 1 is connected stacked in the vertical direction. Each element 1 is formed by alternately laminating a plurality of electrostrictive material layers and a plurality of internal electrode layers. That is, the displacing direction of the elements 1 is vertical. The element 1 assumes the form of a rectangular parallelepiped of square cross section, as shown in FIG. 3.

A stack of the elements 1 is retained by means of a supporting member 7. This supporting member 7, as shown in FIG. 3, is of substantially the same length as the entire length of the connected elements, assuming the form of a tubular rectangular parallelepiped, the cross-sectional area of hollow space of which is greater than that of the element by several millimeters, and is made of an insulating material. In addition, among its four lateral surfaces, two opposed lateral surfaces are each provided with a vertically extending notch so that leads 4a, 4b of the element 1 may pass through.

The upper and lower end portions 1a and 1b of the stack of element 1 retained by the supporting member 7 each abut on the metallic members 3 and 6. One of the metallic members 3 is substantially disc-shaped and, on its lower surface, a recessed portion is formed so that the upper end portions of the supporting member 7 and the stack of element may be received therein. In addition, two lead terminals 2a and 2b are mounted at the metallic member 3 and, to these terminals, the end portions of the leads 4a and 4b extending from each element 1 are connected by solder 10. The other metallic member 6 is substantially disc-shaped. On the upper surface of this metallic member 6, a recessed portion is formed so that the lower end portions of the supporting member 7 and the stack of element may be received therein. The metallic members 3 and 6 are made of stainless steel.

The outer peripheral surfaces of the above-described two metallic members 3 and 6 are each fixed to the upper and lower aperture portions 5a and 5b of the tubular metallic casing 5. The metallic casing 5 is made of stainless steel and can be expanded and contracted in its longitudinal, that is, vertical direction taking the form of, for example, a bellows, as shown. Fixation of the metallic members 3 and 6 to the metallic casing 5 is effected by welding to thereby hermetically seal the stack of element 1.

Incidentally, the stack of element 1 is expanded in advance in the vertical direction by a predetermined length, and a shrinking force caused by the metallic casing 5 and acting in the vertical direction is applied to the above-described stack of element 1.

Next, a manufacturing method of the actuator according to the present invention is described.

An organic binder is mixed with a multicomponent solid solution ceramic powder having a perovskite crystal structure to form into a green sheet of thickness of about 100 μm, on which an internal electrode silver conductor is applied in the form of paste and, after dried, it is laminated by several hundreds layers (for example, 120 layers) and sintered to form a laminated structure. The peripheral portion of the silver internal electrode conductor is exposed onto the lateral surface of the laminated structure. After the peripheral portion is selectively coated with a glass insulating film, two external electrode conductors in the form of comb are formed by alternately connecting the internal electrode silver conductors every one layer. Then the leads 4a and 4b are each connected to these two external electrode conductors by soldering, and the lateral surface is coated with resin. A plurality of elements thus made, prior to sealing, are subjected to thermal treatment at temperatures (for example, 150° to 170° C.) of above the Curie temperature, which are peculiar to the ceramic material, for a period of time (for example, 0.5 to 2 hours) in which polarization is eliminated and, then one end portion 7b of the supporting member 7 having a hollow space greater several millimeters than the profile of the element 1 is fixed to the inner recessed surface of the upper metallic member 3 so that the supporting member 7 may be erected. The elements 1 are inserted into the supporting member from its other end portion 7b by the number adding up to the length of the supporting member 7 (See FIG. 3). Next, the leads 4a and 4b of each element 1 and the internal end portions of the lead terminals 2a and 2b are connected by soldering. Next, one aperture portion 5b of the metallic casing 5 and the metallic member 6 are sealed in advance by welding or the like. Next, from the aperture portion 5a of the metallic casing 5, the other end portion 7b of the supporting member 7, on which the metallic member 3 is fixed, is inserted to fix by means of a fixture so that the end portion 1b of the stack of element 1 adheres closely to the recessed surface of the metallic member 6. Then, the metallic member 3 and the aperture portion 5a of the metallic casing 5 are sealed by welding or the like to complete the sealing. Next, A d.c. voltage (for example, 150 V DC) under which the element 1 can polarize is applied between the external end portions of the lead terminals 2a and 2b, which are mounted to the metallic member 3, for ten to twenty seconds for polarization to make the element 1 expand by a residual polarized amount. If the spring constant of the metallic casing 5 is set so that the shrinking force of the metallic casing 5 relative to the elongation of the residual polarized component accounts for the order of 20 to 100% (for example, 20 to 50 kg.f) of the maximum generating force of the element 1, then a metallic casing-incorporated piezoelectric actuator, which is assembled with the stack of element 1 previously compressed with a force of 20 to 100% of the maximum generating force, can be obtained.

Figure 4:
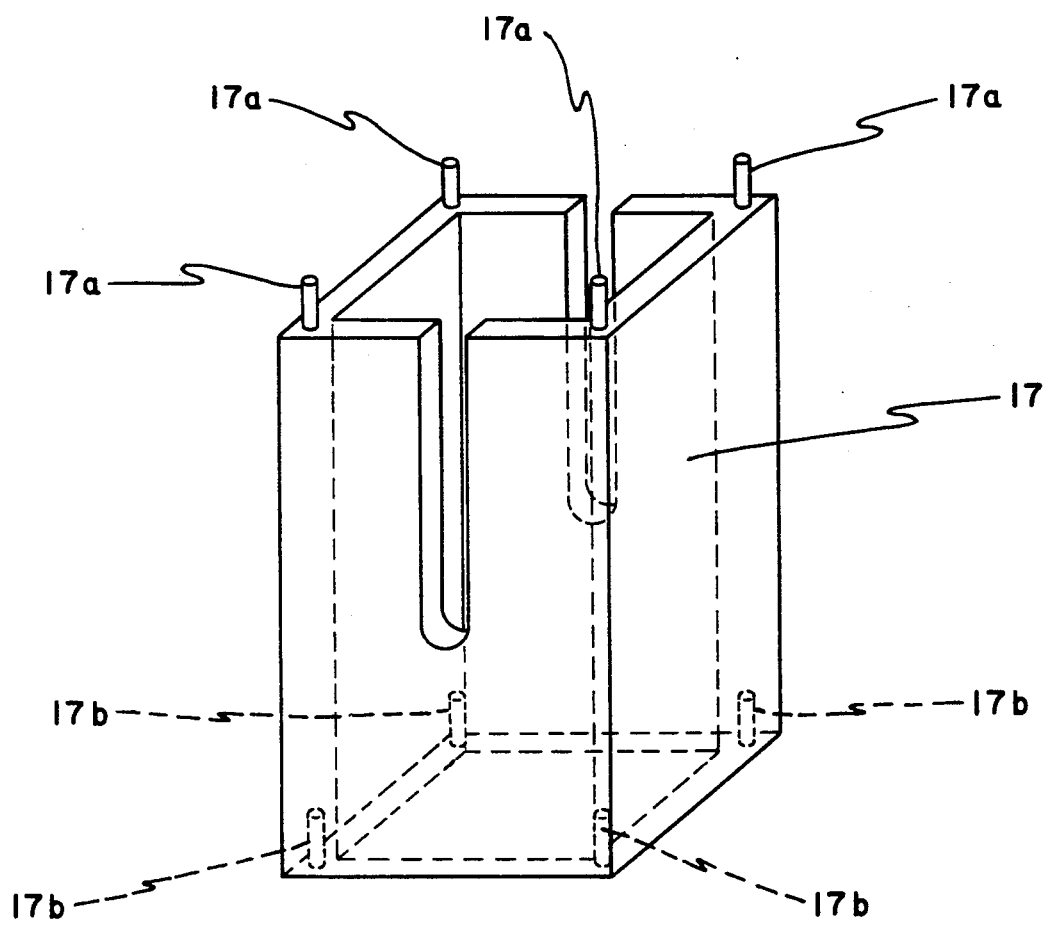
FIG. 4 is a perspective view of a block for constituting a supporting member used in another embodiment of the present invention.

FIG. 4 is a perspective view of a block for constituting a supporting member used in a second embodiment of the present invention.

Although, in the first embodiment, the supporting member 7 is one body and the length thereof corresponds to the entire length of the stacked elements, in this second embodiment, the supporting member is composed of a plurality of blocks 17 and the length of each block is made substantially the same as that of a single element, and a protrusion 17a is provided at four corners of one end surface of the block 17 while, corresponding to this protrusion 17a, a hole 17b is provided at four corners of the other end surface. These four protrusions 17a can be each received within four holes 17b of the other block 17 so that the blocks 17 can be sequentially connected by the desired number to form a supporting member having a desired length.

By achieving such an arrangement, any number of the blocks 17 of the same length can be connected corresponding to the number of the elements used.

What is claimed is:

1. A laminated piezoelectric actuator comprising: a plurality of piezoelectric actuator units housed in an insulating case having a pair of elongated slits in a wall thereof, each of said actuator units being stacked free of an adhesive agent therebetween, each of said actuator units having a pair of lead wires, all of said lead wires passing through a said pair of elongated slits, a hermetically sealed metal case housing said actuator units and said insulating case, said metal case having a pair of external terminals connected to a plurality of pairs of said lead wires within a space between an outer surface of said insulating case and an inner wall of said metal case.

2. A laminated piezoelectric actuator as claimed in claim 1, wherein said supporting member comprises a plurality of blocks, each of said blocks having a length which is substantially the same as the length of a single actuator unit and having a protrusion on at least some of four corners of its one end surface and a hole in at least some of four corners of the other end surface, and said blocks being connected to each other by sequentially fitting said protrusion to said hole of an adjacent block.

3. A laminated piezoelectric actuator comprising: a plurality of electrostrictive elements stacked relative to each other, each of said elements having a structure comprising alternately laminated electrostrictive material layers and internal electrode layers, an enclosure for sealing said elements, said enclosure comprising a metallic casing with at least one metallic member fixed to an aperture in said casing, and a supporting member for stacking said plurality of electrostrictive effect elements in their longitudinally displaced direction, said supporting member having a notch formed on its opposed lateral surfaces for providing an exit for leads connected to said plurality of electrostrictive effect elements, and said supporting member comprises a plurality of blocks, each of said blocks having a length which is substantially the same as the length of a single element and having a protrusion at each of four corners of its one end surface and a hole at each of four corners of the other end surface so as to be connected to each other by sequentially fitting said protrusion to said hole of an adjacent block.

* * * * *